United States Patent [19]

Driessen

[11] Patent Number: 4,675,869
[45] Date of Patent: Jun. 23, 1987

[54] FAST DECODER AND ENCODER FOR REED-SOLOMON CODES AND RECORDING/PLAYBACK APPARATUS HAVING SUCH AN ENCODER/DECODER

[75] Inventor: Leonardus M. H. E. Driessen, Eindhoven, Netherlands

[73] Assignee: U.S. Philips Corporation, New York, N.Y.

[21] Appl. No.: 705,752

[22] Filed: Feb. 26, 1985

[30] Foreign Application Priority Data

Feb. 29, 1984 [NL] Netherlands ................. 8400629

[51] Int. Cl.$^4$ .............................................. G06F 11/10
[52] U.S. Cl. .......................................... 371/37; 371/39
[58] Field of Search .................... 371/39, 40, 37, 38

[56] References Cited

U.S. PATENT DOCUMENTS

| | | | |
|---|---|---|---|
| 4,142,174 | 2/1979 | Chen et al. | 371/37 |
| 4,162,480 | 7/1979 | Berlekamp | 371/37 |
| 4,476,562 | 10/1984 | Sako et al. | 371/39 |
| 4,497,058 | 1/1985 | Sako et al. | 371/39 |
| 4,527,269 | 7/1985 | Wood et al. | 371/37 |

*Primary Examiner*—Charles E. Atkinson
*Attorney, Agent, or Firm*—William J. Streeter; Anne E. Barschall

[57] ABSTRACT

A decoding device for code words which are protected against the occurrence of several symbol errors per code word by means of a Reed-Solomon code is provided with a word buffer which comprises a space for the storage of an erasure indication per symbol received. For correction of the code word, first the syndrome symbols are formed by multiplication by the parity check matrix. The sum of twice the number of error symbols and once the number of erasure symbols may not be larger than the number of syndrome symbols. First the syndrome symbols are modified so that the syndrome symbols which could possibly relate to error symbols (non-erasure symbols) are no longer influenced by the erasure symbols. The key equation and error locator equation for the non-influenced syndrome symbols can then be separately solved, so that the locations of error symbols can be found. The latter syndrome symbols are then modified, when necessary, for calculated error locations, while the error values or erasure values are determined from a set of mutually independent syndrome symbols whose number equals the sum of error symbols and erasure symbols. There is provided an arithmetic unit for the Galois-field which, for the sake of simplicity, performs the calculations on the exponents of the symbols which are written as powers of the basic symbol of the Galois-field.

10 Claims, 16 Drawing Figures

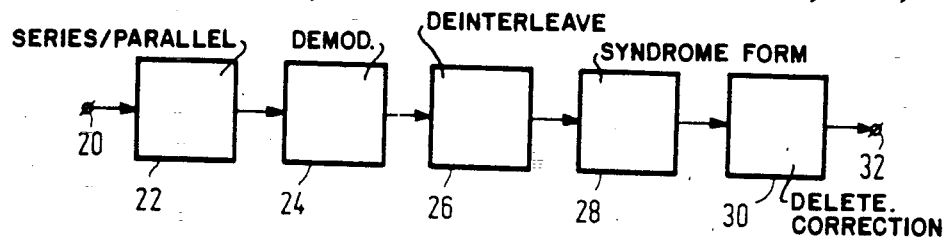
FIG.1
$$[H] = \begin{Bmatrix} (a^b)^{n-1} & (a^b)^{n-2} & \cdots & (a^b)2 & a^b & 1 \\ (a^{b+1})^{n-1} & (a^{b+1})^{n-2} & \cdots & (a^{b+1})2 & a^{b+1} & 1 \\ \vdots & & & & & \vdots \\ (a^{b+d-2})(n-1) & (a^{b+d-2})(n-2) & \cdots & (a^{b+d-2})2 & (a^{b+d-2}) & 1 \end{Bmatrix}$$
FIG.2
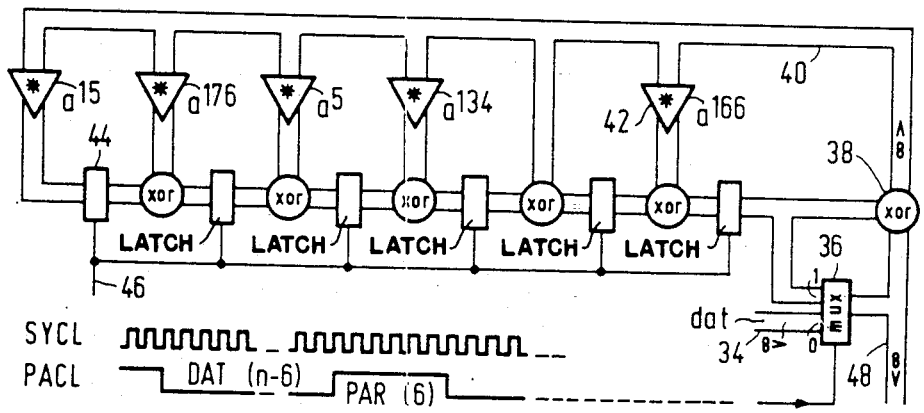
FIG.3

| name | bits | description |
|---|---|---|
| EEP | 1 | External Erasure Pointer |
| RES | 8 | REceived Symbol |
| SFL | 1 | Symbol FLag |
| COS | 8 | COrrected Symbol |
| UFL | 1 | Unreliability FLag |
| UEP | 1 | Uncorrectable Error Pattern |
| LCO | 8 | Location COunter |
| WLE | 8 | Word LEngth |
| JMP | 1 | JuMP |
| STP | 1 | SToP |
| ZSS | 1 | Zero Source Symbol |
| SOS | 8 | SOurce Symbol |
| BME | 8 | B-MEmory |
| COR | 1 | CORrection |
| ERD | 1 | Erasure ReaD |
| SRD | 1 | Syndrome ReaD |
| EDS | 1 | Encoding / Decoding Switch |
| ANE | 3 | Allowed Number of Erasures |
| ANF | 3 | Allowed Number of errors (Faults) |
| NOS | 3 | Number Of Syndromes |
| I | | |
| RAT | 1 | RAnge Test |
| TST | 4 | TeST lines |
| RST | 2 | ReSulT lines |
| II | | |
| NEE | 1 | allowed Number of Erasures Exceeded |
| NER | 3 | Number of ERasures encountered |
| NES | 3 | Number of Effective Syndromes left |
| III | | |
| WAD | 4 | W-memory ADdress |
| WWR | 1 | W-memory WRite |
| WRD | 1 | W-memory ReaD |
| HAD | 4 | H-memory ADdress |
| HWR | 1 | H-memory WRite |
| HRD | 1 | H-memory ReaD |
| IDS | 1 | Indirect / Direct Switch |
| AWR | 1 | A-memory WRite |
| BWR | 1 | E-memory WRite |
| LRD | 2 | Logarithm ReaD |
| MUL | 1 | MULtiplication |
| BAC | 1 | B-memory ACcumulation |
| ZAC | 1 | Zero ACcumulation |
| RRD | 2 | Root ReaD |

FIG.5

| name | SEQ-bits | description |
|---|---|---|
| WAD | 0-3 | $WAD = \sum_{i=0}^{3} 2^i \times SEQ(i)$ |
| HAD | 4-7 | $HAD = \sum_{i=4}^{7} 2^{i-4} \times SEQ(i)$ |
| RRD1 | 8 | let k := RRD1 + 2 × RRD2 then |
| RRD2 | 9 | WRD = 1   if k = 0 and REN = 0 |
| REN | 10 | HRD = 1   if k = 1 and REN = 0 |
|  |  | SRD = 1   if k = 2 and REN = 0 |
|  |  | ERD = 1   if k = 3 and REN = 0 |
|  |  | QEQ = 1   if k = 0 and REN = 1 |
|  |  | TEQ = 1   if k = 1 and REN = 1 |
|  |  | RT = 1   if k = 2 and REN = 1 |
|  |  | ZER = 1   if k = 3 and REN = 1 |
| -- | 11,15,19 | spare |
| WWR | 12 |  |
| HWR | 13 |  |
| IDS | 14 | direct if IDS = 0 |
| LRD1 | 16 | let k := LRD1 + (2 × LRD2) then |
| LRD2 | 17 | LOG   if k = 0 |
|  |  | LGQ   if k = 1 |
|  |  | LGS   if k = 2 |
|  |  | LGI   if k = 3 |
| AWR | 18 |  |
| MUL | 20 |  |
| ZAC | 21 | accumulate : |
| BAC | 22 | BME   if BAC = 1 |
|  |  | 0   if BAC = ZAC = 0 |
|  |  | 1   if BAC = 0 and ZAC = 1 |
| BWR | 23 |  |
| COR | 24 |  |
| RAT | 25 | $SOS \notin \{ a^i \mid 0 \leq i \leq n-1 \}$ |
| RST1 | 26 | let k := RST1 + 2 × RST2 then |
| RST2 | 27 | no action   if k = 0 |
|  |  | stop, correction impossible   if k = 1 |
|  |  | stop, correction completed   if k = 2 |
|  |  | jump   if k = 3 |
| TST1 | 28 | let k := TST1 + 2 × TST2 + 4 × TST3 |
| TST2 | 29 | SOS = 0   if k = 0 and TST4 = 0 |
| TST3 | 30 | SOS ≠ 0   if k = 0 and TST4 = 1 |
| TST4 | 31 | NER ≤ k   if 1 ≤ k ≤ 7 and TST4 = 0 |
|  |  | NES ≤ k   if 1 ≤ k ≤ 7 and TST4 = 1 |
| NAD | 32-39 | $NAD = \sum_{i=0}^{7} 2^i \times SEQ(32 + i)$ |

FIG.12

FAST DECODER AND ENCODER FOR REED-SOLOMON CODES AND RECORDING/PLAYBACK APPARATUS HAVING SUCH AN ENCODER/DECODER

BACKGROUND OF THE INVENTION

The invention relates to a decoding device for code words which are protected against the occurrence of a plurality of symbol errors per code word means of a Reed-Solomon code, comprising:

a. receiving means and buffer means for the sequential storage of the code symbols of a code word;

b. first arithmetic means which are connected to the receiving means in order to determine a series of syndrome symbols from the code word by means of the parity check matrix of the code;

c. second arithmetic means which are fed by the first arithmetic means for solving the key equation in order to determine the positions of any incorrect symbols from the key equation by way of zero points of the error locator equation and to evaluate, using error positions thus found, associated symbol errors in order to present code symbols which are correctable by way of any position data and associated error values on a user output.

A device of this kind is described in the previous, non-prepublished Netherlands Patent Application No. 8302214 (PHN 10.710) corresponding to U.S. patent application Ser. Nos. 562,611 now abandoned and 824,299, in the name of Applicant which is incorporated herein by way of reference. The prior art technique concerns a code whereby a large number of errors can be repaired per code word. For this purpose complex calculations are required in order to draft the key equation, followed by solution of this equation and the error evaluator/locator expressions, inter alia by performing a so-called Chien search during which the correctness of all symbols can be successively tested when it is detected that the number of symbol errors exceeds 3. It is an object of the invention on the one hand to reduce the largest number of symbols which can be corrected per code word, thus allowing for a simplified calculation. On the other hand it is an object to perform the processing very quickly, the decoding operation then involving the direct use of any already present information concerning symbols deemed to be unreliable (so-called erasure symbols) in order to remove this pointer information from the error description and to simplify the error description. This permits using a comparatively limited amount of redundancy, correction of a number of errors which is larger than the number determined by the minimum Hamming distance for the code as a whole. This is because two redundant symbols are required per incorrect symbol when an error location is not known. When the location of an incorrect symbol is known, this error can be corrected by way of a single redundant symbol.

SUMMARY OF THE INVENTION

The object in accordance with the invention is achieved in that d. for each code symbol said buffer means have a storage capacity for storing, together with a code symbol, an erasure indication relating to the relevant code symbol;

e. a connection is provided between the buffer means and the second arithmetic means in order to correct, under the control of the erasure indication, the series of syndrome symbols as regards the effect of erasure symbols, thus forming a series of syndrome symbols which is reduced by one syndrome symbol for each erasure symbol in order to calculate any positions of error symbols therefrom;

f. said second arithmetic means are suitable for treating all error symbols with erasure symbols thus localized as secondary erasure symbols;

g. said second arithmetic means comprise a Galois-field arithmetic unit in order to enable, by conversion of the symbols into the associated exponent of the basic element of the Galois-field, operations to be performed on different powers of the relevant code symbol.

A flexible correction procedure is thus obtained. External pointer information of incorrect symbols can be realized, for example by the detection of an analog signal level or by the detection of inadmissible bit patterns. Similarly, pointer information for an incorrect symbol can be internally generated. U.S. Pat. No. 4,142,174 provides a simple and hence fast correction of at the most three incorrect symbols per code word, but the flexibility of this method is not high and, for example already present pointer indications are not used so that the ultimate repair capability is less than that of the present invention. By addition and subtraction the Galois-field arithmetic unit can quickly perform operations which correspond to multiplication and division of the symbols.

For code words which are systematic at the symbol level, said first arithmetic means preferably comprise a control input (EDS) for an encoding/decoding signal in order to form syndrome symbols from a code word under the control of the decoding signal and to form subsequently, under the control of erasure indications, a set of error locations from the syndrome symbols and an error value for each error location. Under the control of an encoding signal, a series of parity symbols from a series of data symbols of a data word as erasure symbols are formed in the locations of the parity symbols which have been corrected with respect to the already present symbols. This extension is based on the fact that during the encoding operation the same parity symbols are formed as if they were erasure symbols in the decoding situation. It will be apparent that in given circumstances a saving is achieved by the dual use of parts for encoding as well as for decoding. Before encoding, the symbols already present in the parity locations may have the value zero or any other value.

Preferably, said buffer device comprises two alternating buffer elements, each of which serves to accommodate a complete code word, with each buffer element there being associated a memory for the erasure locations, each of said memories being addressed by an associated counter which is decremented by a read control signal and which is incremented by a write control signal. The counting of the number of erasure symbols in a code word represents a simple aid for the selection of the mode of operation. When the number of erasure symbols becomes too high, correction will become impossible. When the counter position has decreased to zero, all erasure symbols have been treated and can also be simply detected. Notably when the maximum number of permissible erasure symbols is comparatively small (six in the present embodiment), the construction of these memories as a random access memory represents a simple solution.

Preferably, said Galois-field arithmetic unit comprises a chain which is formed by a converter for converting a symbol into an element of the set (exponent, double exponent, inverted exponent, halved exponent), a selectively activatable adder which is provided with a bypass, and a second converter for reconverting an exponent into the associated symbol. This results in a simple device which allows for the flexible execution of a large number of relevant calculations.

Preferably, said first arithmetic means comprise a parallel connection of (d−1) registers, each of which serves for a provisional syndrome symbol, a series connection of (d−2) multiplier elements for multiplying each symbol received by the basic element of the relevant Galois-field, each multiplier element being connected between the inputs of two successive registers, per code symbol received the registers being cyclically driven in the sequence of the multiplier elements, an exclusive-OR circuit XOR which comprises a code symbol input and a feedback input which is fed by all registers of the parallel connection, the output of the exclusive-OR circuit being recoupled to the series connection and also constituting an output of the first arithmetic means. This results in a fast-operating configuration. In order to obtain an even higher speed, a further symbol register may be arranged between the exclusive-OR circuit and the series connection.

Preferably, said buffer means comprise a counter LCO which can be loaded by an adjustable register WLE in order to count down the number of symbols received and to form a "reception completed" signal when a predetermined position is reached. The word length can thus be readily adjusted under software control.

Preferably, said second arithmetic means comprise a strategy-determining register for prestoring the maximum permissible count of erasure symbols in a code word and for selectively supplying an uncorrectability signal. When the number of erasure symbols in a code word received is larger than said maximum count a second strategy-determining register stores the maximum permissible count of error symbols in excess-of-the-erasure-symbols selectively supplies an uncorrectability signal when the number of error symbols found in a code word is larger than said maximum count. The strategy can thus be adjusted in various ways, depending on the requirements imposed as regards safety and correction capability.

Preferably, said Galois-field arithmetic unit comprises two parallel connected processor memories which are bidirectionally connected to said chain as well as to a connection to further part of the second arithmetic means. The speed is thus further increased because read and write operations can be simultaneously performed.

BRIEF DESCRIPTION OF THE FIGURES

The invention will be described in detail hereinafter with reference to some Figures; the environment and philosophy of the invention, the encoding and the decoding will be successively dealt with:

FIG. 1 shows a block diagram of a data processing device in which the invention is used;

FIG. 2 shows an example of a parity check matrix (H);

FIG. 3 shows an encoder on the basis of a retrocoupled shift register;

FIG. 5 shows a list of names occurring in the device shown in FIG. 4;

FIG. 12 shows the meaning of given lines and bits in FIG. 11.

Figure 4:
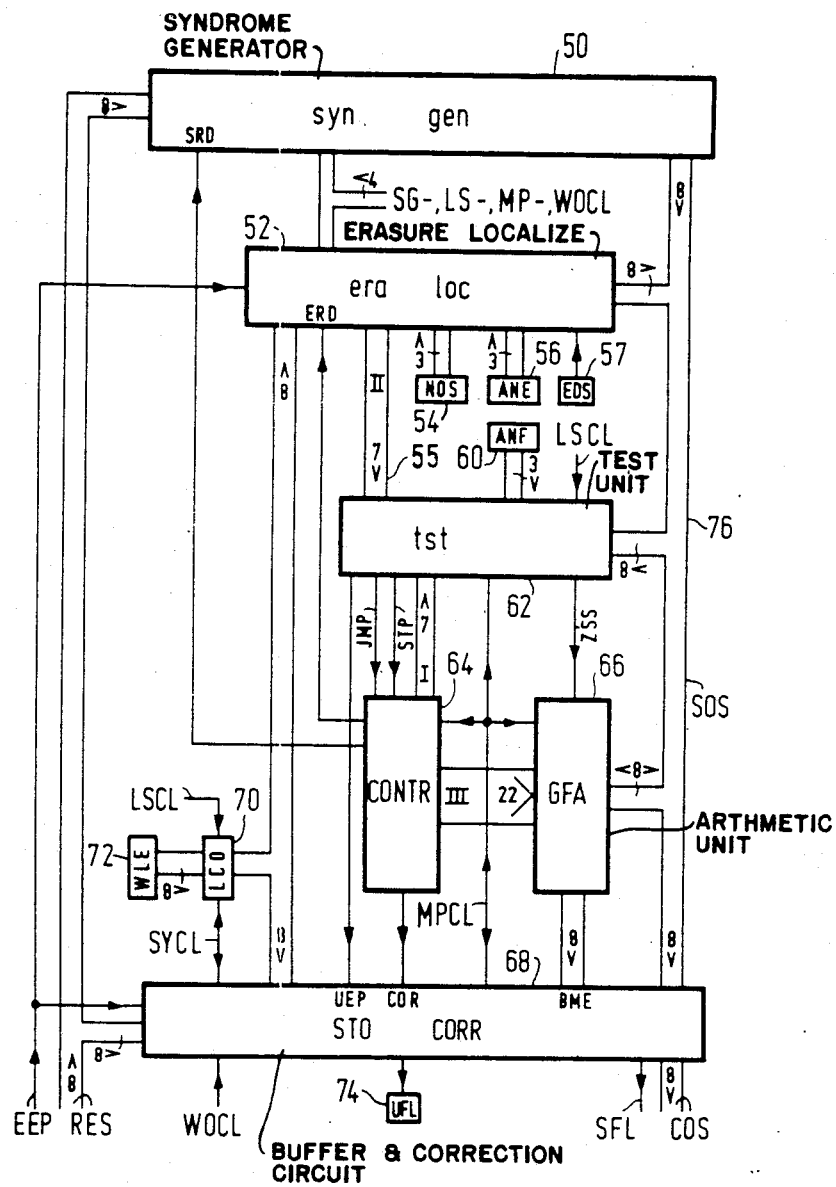
FIG. 4 shows a block diagram of a decoding device in accordance with the invention.

Various complex formulae are separately shown in the form of a table.

THE ENVIRONMENT AND PHILOSOPHY OF THE INVENTION

FIG. 1 shows a block diagram of a device for the preparing for use of information which is serially received, for example from a magnetic tape, and which is protected by a Reed-Solomon code. Feedback effects which could occur at various higher levels during the treatment have not been taken into account. The information is received on input 20, that is to say bit serially. In block 22 series/parallel conversion is performed for the symbol-wise further processing of the information. Demodulation takes place in block 24. Superfluous spacing bits (between the symbols) can thus be removed and the symbols modulated in channel bits can be translated into code symbols (because redundancy is removed). Only this symbol information, with or without flag bits, will be further processed. In the present embodiment, all symbols comprise 8 bits, but this is not a fundamental restriction. A flag bit can act as a quality indication (reliable/unreliable) for the associated symbol. For example, when a symbol in the bit stream received does not satisfy the modulation rules, the symbol can be indicated as being unreliable. The flag bits can contain information relating to a level which is higher than the symbol level, but this will not be considered herein. If necessary, de-interleaving is performed in block 26 so that the symbols of a code word are arranged to be successive in time thereafter. In block 28 the associated syndrome symbols are formed from the data symbols and redundant symbols of a code word, and corrections are made or not on the basis of flag bits and syndrome symbols. When corrections are necessary but not possible because of an excessively large number of errors, mitigating steps may be taken in block 30. Although the correct information cannot be restored in this manner, the annoyance to a user due to incorrect symbols can in many cases be reduced, for example by presenting a code symbol consisting exclusively of "0" bits. The information becomes available to a user via output 32. The procedure to be described hereinafter is particularly suitable for "consumer" information, for example information representing images and/or sound. In special cases also for example, program information or data for a computer environment may be concerned. The relevant use has its consequences for the steps taken in block 30, but the invention does not relate thereto.

Correction/detection takes place in block 28 on the basis of a Reed-Solomon code. The symbols of the code are defined over a Galois-field GF(q); in the present embodiment q=256. The generator polynomial is a continual product $g(x)=\text{pi}$ ($i=0 \ldots d-2$) of factors $(x-a^{b+i})$, the minimum Hamming distance being equal to d. Therein, a is the primitive element and b is an arbitrary integer number. In the present embodiment b=0 is chosen so that $g(x)=(x-1)(x-a)(x-a^2) \ldots (x-a^{d-2})=x^{d-1}+Ax^{d-2}+Bx^{d-3}+ \ldots +G$. In this respect FIG. 2 shows a matrix [H] which can be used as a parity check matrix. The set $\{a^{b+i}\}$ represents the basic symbols of the code. Multiplication of a code word by the matrix $[H^T]$ produces a syndrome vector S. For each symbol of a code word an erasure flag bit is defined upon decoding. When this flag bit has the value "1", the symbol may be correct or incorrect. The value of the error is determined as a correction symbol which is to be added bit-wise modulo-2 to the incorrect symbol in order to obtain the correct symbol. For an incorrect symbol for which the erasure flag has the value "0", the position is also unknown. Within one code word, the code is capable of simultaneously correcting t errors, reinstating e erased symbols and detecting f incorrect symbols, for a long as $2t+e+f \leq d-1$.

ENCODING

Encoding can be performed by means of the retrocoupled shift register shown in FIG. 3. In the present embodiment, however, preference is given to an implementation in which the same device is capable of encoding as well as decoding. Consequently, encoding will be simpler because no branch operations will be required in the program. For the sake of simplicity, various secondary procedures will be described hereinafter with reference to the arithmetic programs in the higher programming language RTL/2. It is to be noted that programming languages are artificial languages, so that any resemblance to languages spoken by humans or other intelligent beings is purely coincidental. The advantage of the representation used herein over flowcharts consists in that the present representation is much more compact.

Upon encoding, $(n-d+1)$ data symbols are converted into n code symbols. For the sake of simplicity, a systematic code will be described, which means that each data symbol corresponds directly to one associated code symbol, so that the $(d-1)$ further code symbols are real redundant symbols. This restriction is not fundamental.

Each code word must be divisible by the generator polynomial of the code g(x). The information words m(x) have a degree of at the most $(n-d)$. Therefore, the remainder $r(x)=x^{d-1} m(x) \mod (g(x))$ has at the most the degree $(d-2)$, while $c(x):=x^{d-1} m(x)+r(x)$ is a code word beginning with all data symbols. In FIG. 3, the information arrives on the 8-bit wide input 34 and is conducted, via multiplexer 36, to output 48 and also to the 8-bit wide exclusive 'OR circuit 38. Furthermore, during the same operation the relevant symbol is multiplied in the multiplier elements, such as the element 42, by $a^{15}$, $a^{176}$, $a^5$, $a^{134}$, $a^0$ ($=1$) and $a^{166}$, respectively, in order to be stored in the latch circuits such as the element 44. These successive factors are the successive coefficients A ... G produced by calculation of the generator polynomial by multiplication. After the reception of the data symbols of one code word, all redundant symbols have been determined and the multiplexer 36 is switched over in order to present these six symbols to the output 48. The multiplier elements need not be deactivated, because only "zero" symbols are retrocoupled when the redundant symbols are shifted out. When all redundant symbols have been applied to the output, the latch circuits are activated again by signals on line 46 in order to form a next code word. At the bottom of the Figure there are shown the symbol synchronization signal SYCL and the parity control signal which controls the multiplexer 36. As has already been stated, the code is capable of reincarnating a number of $d-1$ erasure symbols. In the case of a systematic code, the symbols may also be redundant symbols. It will now be apparent that the decoder is capable, by indicating the locations of the redundant symbols by a "pseudo-erasure" flag, of reincarnating these symbols, so that it can also act as an encoder.

DECODING

During the decoding operation, the decoder searches for a word received, the next-nearest correct code word, in as far as the Hamming distance, as determined over the symbols which are not erasure symbols, at the most equals $[(d-1-e)/2]$, in which $e<d$. When this code word cannot be found, an alarm bit is attached to the relevant word. The calculations are performed in the Galois-field $GF(2^8)$ as commonly done for the error correction in the "Philips Compact Disc" (R) system. Reference is already made to FIG. 4 which shows a general block diagram of the decoder in accordance with the invention. The symbols are byte-serially received by RES, together with a pointer flag bit EEP which is produced, for example by the demodulation. This information is applied to block 68 which acts as a buffer and correction device. The code symbols are applied to element 50 in which the syndromes are formed, the operation being synchronized by a number of clock signals. The first clock signal is a 16 kHz word clock WOCL which produces a signal transition after each word. The second clock signal is a 32 kHz symbol clock LSCL which is high each time when the last symbol of a word is received (consequently, after that all syndrome symbols are known) and is otherwise low. The third clock signal is a microprocessor clock MPCL of 4 MHz which serves to synchronize the symbol treatment per period of the signal LSCL, so that after each half period of WOCL a new word can be received (more than 256 symbols per word is in principle impossible because the symbol length is restricted to 8 bits). The fourth clock frequency SGCL amounts to 24 MHz and serves to perform the relevant operations during the period in which a symbol is received. Finally, the syndrome generator 50 receives the signal SRD for controlling the reading of the syndromes formed. The code words are processed with a time overlap. During the decoding of a given code word, the directly preceding code word is applied to a user (decoded) while the next code word can be received, the syndrome symbols being formed coincidentally with the reception.

Component 76 is the symbol bus for communicating syndrome symbols and corresponding data bytes between the various components. The syndrome generator 50 acts as the source. Other sources are the elements 66, 52. Destinations are elements 62, 66, 68 as will be described hereinafter. Element 52 localizes the erasure symbols. To this end, it receives first of all the pointer signals EEP. Register 72 contains the information concerning the word length (in number of symbols). At the beginning of a new word, the counter 70 is each time loaded with this information, so that the erasure locator 52 and the buffer/correction device 68 can use this information. Loading is controlled by the clock LSCL, and resetting by the clock SYCL. Erasure locator 52 also receives a control signal from the control unit 64, an information NOS from the register 54 which indicates the number of syndromes in the code word (which can thus be adjusted under external control), an information ANE from the register 56 which indicates the total number of permissible erasure symbols (with a maximum of six in the presence of six redundancy symbols), and a switch-over bit EDS from a flipflop 57 which indicates whether the circuit is used for encoding or for decoding. Element 62 is the test unit. This unit receives a 7-bit signal from the erasure locator 52, that is to say a 1-bit signal NEE for indicating whether the permissible number of erasure symbols for the relevant word was exceeded, because in that case correction will not be possible. Also received (again on bundle 55) are a three-bit signal NER which indicates the actual number of erasure symbols, and a three-bit signal NES which indicates the number of remaining effective syndrome symbols and wherefrom further incorrect symbols can be detected and/or corrected outside the erasure symbols. The test unit 62 also receives a three-bit signal ANF from the register 60 which indicates the total number of incorrect, nonerasure symbols which is permissible for correction: this variable is co-determined by the correction strategy followed. Furthermore, the test unit 62 receives a 7-bit control signal from the control unit 64, comprising a 1-bit signal RAT which controls the execution of a test as regards the permissibility of the errors and which is further used for decrementing the counter which enumerates the number of errors yet to be treated. Also received are a four-bit signal TST and a two-bit signal RST (see hereinafter). The test unit 62 supplies a jump control signal JMP and a stop control signal STP to the control unit, and a signal ZSS which indicates a symbol having the value zero (hex00) for for the Galois-field arithmetic unit 66. For each symbol received the test unit is synchronized by means of the clock MPCL. The test unit also outputs a 1-bit signal UEP to the unit 68 in order to indicate that the relevant word contains an uncorrectable error pattern.

Element 64 is the control unit which outputs a number of successive control signals for each word, synchronized by the clock MPCL. It applies a signal COR to the element 68 in order to indicate when a correction must take place, so that the contents of the element 68 can be further used. The signals JMP, STP, and SRD have already been described, ERD is the control signal for reading and erasure. Furthermore, a 22-bit control signal is applied to the Galois-field arithmetic unit 66. For the WME memory to be described hereinafter, this concerns a 4-bit address and also a write control signal and a read control signal. The memory HME to be described hereinafter is controlled by a similar series of signals. Finally there are the signals IDS (1bit) for selection between direct and indirect, a 1-bit signal AWR for writing in the A-memory, a 1-bit signal BWR for writing in the B-memory, a two-bit signal LRD for reading a logarithm, a 1-bit signal MUL for controlling a multiplication, a 1-bit signal BAC for controlling an accumulator operation of the B-memory, a 1-bit signal ZAC for controlling a zero accumulation, and a two-bit signal RRD for reading a root (zero point of a polynomial). The arithmetic unit 66 (GFA) for the Galois-field is synchronized by the clock MPCL, communicates bidirectionally with the bus 76, receives a number of control signals (already described), and applies an 8-bit signal BME to the unit 68 as generated on the outputs of the B-memory.

Finally, the symbol buffer and correction unit 68 receives a 1-bit signal UFL from flipflop 74, for example to indicate that an uncorrectable word must be considered to be generally unreliable. The latter means that all symbols of the word themselves are also unreliable. Synchronization is performed by the clock signals SYCL, MPCL and WOCL. Also received are the control signsls UEP and COR. On its output COS, this element outputs symbols (corrected or not) and on its output SFL it outputs each time 1 flag bit for each symbol output.

Figure 6:
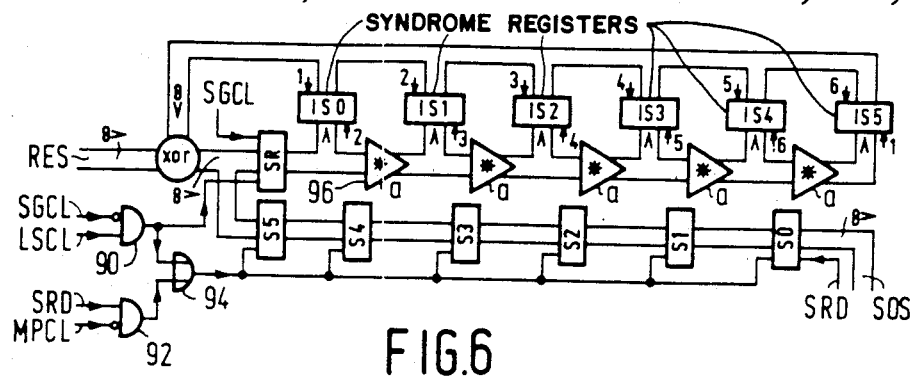
FIG. 6 shows a syndrome generator.

FIG. 6 shows the syndrome generator (50 in FIG. 4). Many mnemonics have already been discussed. Via two logic AND-gates 90, 92 (each time comprising an inverted input which is indicated by a circle) and a logic OR-gate 94, the four clock pulse series received are decoded. Two operations can be simultaneously performed by the insertion of the register SR: multiplication in the elements denoted by "a" and addition in the exclusive-OR element XOR. Furthermore, the resetting of the syndrome registers IS0 . . . IS5 is simplified. Each of the latter registers comprises two clock inputs, one of which is shown at the upper side for controlling the output, and one at the lower side for controlling the loading. As is shown, these clock pulses form part of a six-fold cycle (1 . . . 6) which is repeated, for each symbol received, by way of the six-fold pulses per symbol SGCL. The decoding of this series has been omitted for the sake of simplicity. The Figure also shows the multiplier elements, denoted by "a", such as the element 96; therein, each time a multiplication by "a" is performed. As soon as a word consisting of n symbols has been completely received, the registers SR, IS0, . . . IS4 have the contents "0" and the register IS5 is reset to zero when the first symbol of the next word arrives: register S0 has a tristate output. If desired, the assembly formed by the registers IS0, IS1 and the multiplier elements "a" connected parallel thereto can be implemented as one module. By repeating this module a number of (p) times, a number of 2p syndrome symbols can be formed. It will be apparent that a number of syndrome symbols in excess of the number of parity symbols formed during encoding does not make sense. However, encoding can also be performed with an arbitrary number of parity symbols (provided that the program allows for the relevant degree of redundancy).

SYMBOL BUFFERING AND CORRECTION

Figure 7A:
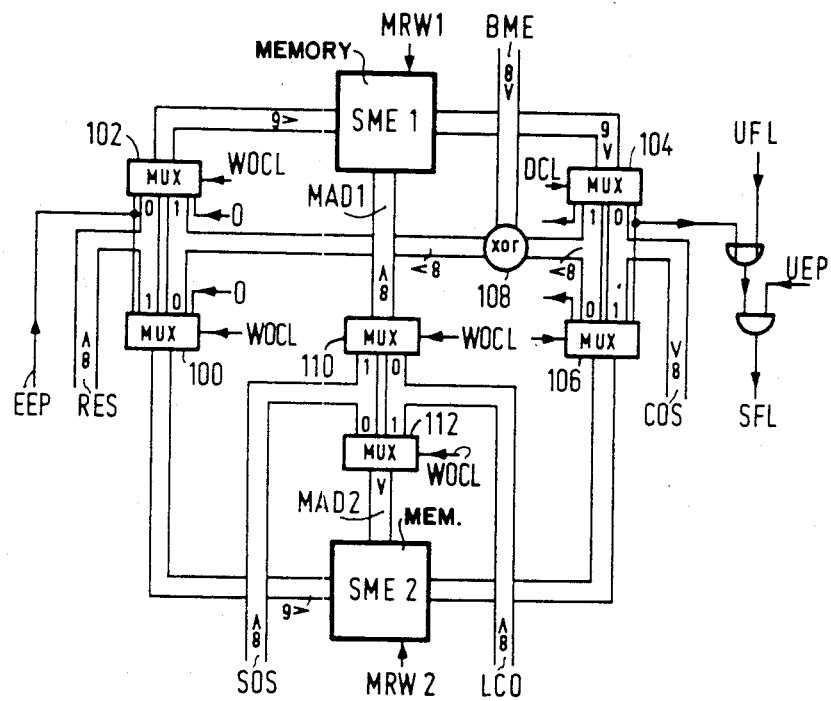
FIGS. 7a and 7b shows a buffer/correction unit 68 of FIG. 4.
Figure 7B:
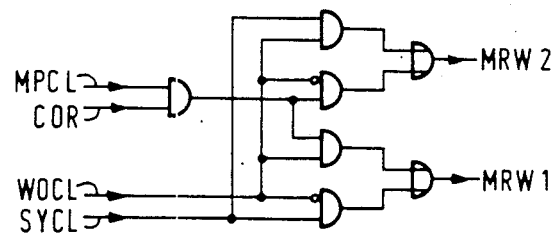

FIGS. 7a and 7b show a more detailed diagram of the unit 68 of FIG. 4 for the buffering and correction of the symbols received. Storage takes place in the two memories SME1, 2 of the random access type which have a capacity of 256 symbols of 8 bits plus flag bit. Thus, the capacity suffices for a code word of any length which is permissible within the scope of the code, input and output (de)multiplexer also being provided. The successive code words can be applied alternately to the memories SME1 and SME2 at the input. In the memory which is not used for input, the symbols to be corrected are then written over by the other inputs of the multiplexers 100, 102, while a flag bit "0" (means reliable) is supplied as indicated. At the output side, the memory filled with corrected information is read on the output line COS (simultaneously with the renewed filling of this memory), any flag bits also being presented on the output. Symbols to be corrected can then be applied from the other memory to the bit-wise exclusive-OR circuit 108, the associated flag bits being reset. Updating is performed by means of said byte BME. During filling/vacating, the two memories SME1, 2 are addressed by the information of the symbol counter (LCO) and during correction by the information of the symbol bus SOS, the procedure being performed by means of multiplexers 100, 112. During reading/writing of a complete word, synchronization is provided by the clock SYCL enabled by the word clock WOCL. Synchronizing for correction is performed by the control signal COR in conjunction with the 4 MHz clock MPCL, enabled again by the signal WOCL.

There are two attractive ways of storing the symbols $(0 \ldots i \ldots n-1)$ of a word in the memories SME1, 2. The first method consists in that the rank number i equals the address, or the address running backwards $(n-1-i)$. In that case storage space can be saved if the word length, i.e. the highest permissible value of n, is limited, so in the case it can always be (substantially) smaller than 256 symbols. The second possibility consists in that the addresses and the rank numbers are logarithmically related, so that the symbol i stored at the address $a^{n-1-i}$. In that case the counter LCO each time counts from $a^{n-1}$ to $a^0$.

The flag bits EEP received may be received from an external source, for example from the demodulator. When an uncorrectable word has been received, either all flag bits are output on the output without modification or all flag bits of the relevant word are set to 1. This is because in this case the bit UEP is "1", while the latter choice is controlled by the value of the bit UFL. Control is performed by means of five AND-gates as indicated, two of which comprise an inverting input, and two OR-gates which are shown in the same way as in FIG. 6.

ERASURE LOCATOR

Figure 8A:
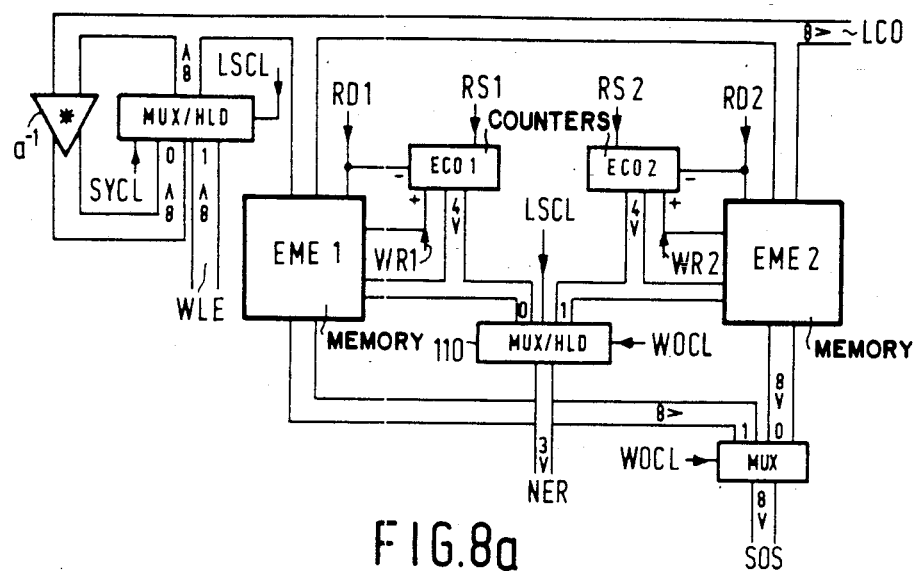
FIGS. 8a, 8b, 8c show an erasure locator.
Figure 8B:
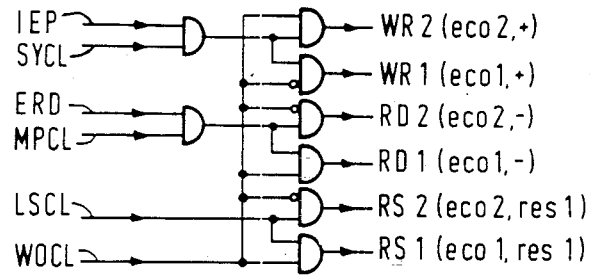
Figure 8C:
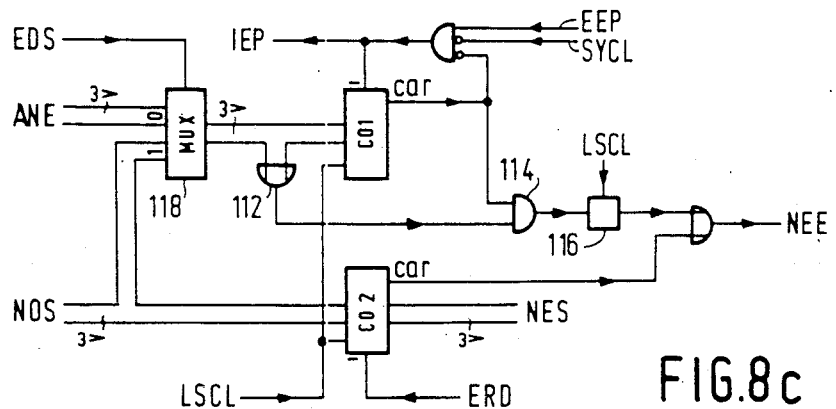

FIGS. 8a, 8b, 8c show the erasure locator, that is to say successively the subsystem elements, the formation of the internal synchronization signals, and the formation of the internal condition signals. There are two memories EME1, 2, each of which is associated with one of the two memories SME1, 2 of FIG. 7a. The positions of the address counter act as data. The erasure symbols are counted in the counters ECO1, 2 which also operate as address counters for the local memories. The storage capacity is chosen to be 16 words of 8 bits (actually 6 words would already suffice). The counters comprise an incrementation input which is controlled together with a write operation (an additional erasure symbol is received) and a decrementation input which is controlled together with a read operation (the control unit requests the information of a further erasure symbol). Before the reception of a new code word, the associated address counter is set to 1. After reception of the entire word, the counter contains the total number of erasure symbols, the latter information forming the information NER via a three-bit multiplexer structure.

For FIG. 8a, FIG. 8b shows the selective formation of write signals (WR), read signals (RD) and erasure control signals for the memories EME1, 2 and the counters ECO1, 2, respectively. The signal WOCL each time selects only one half of the organization.

FIG. 8c shows the central control section of the erasure locator. The encoding/decoding bit EDS conducts either the permissible number of erasure symbols ANE (in the case of decoding) or the permissible number of syndromes (NOS) for storage in the counter CO1. The erasure symbols (EEP) received decrement this counter, synchronized by $\overline{SYCL}$ in order to form the secondary erasure flag IEP until a borrow signal from counter CO1 blocks further decrementation; consequently, the signal IEP can only be formed a predetermined number of times per word. The variable NOS forms the used or effective minimum distance of the code; it will be apparent that the real code distance "d" may never be exceeded. It also holds good that ANE may never be larger than NOS. The counters CO1 and CO2 are loaded under the control of the clock LSCL. When a carry signal appears from the counter CO1 and the signal conducted by the multiplexer 118 is not equal to zero (in which case the OR-gate 12 which combines the three bit lines thus supplies a logic "1"), AND-date 114 outputs a "1". At the end of the word, this "1" is stored in the latch stage 116 which is made transparent by the signal LSCL in order to receive the signal NEE. The latter indicates the impossibility of correction.

The information NOS=0 deactivates the decoding; a borrow carry signal to the counter CO2 is then directly formed, so that the "uncorrectable" signal NEE is formed. At the correct instant the signal UEP is formed therefrom (FIGS. 7/10) in order to provide all symbols with an unreliability flag. The signal NES indicates how many syndrome symbols of a word stored can still be effectively used for error correction. For these signals see FIG. 4, connection 55. When the information ANE has the value zero, only errors will be corrected but not erasure symbols.

During encoding the signal EDS=1 in order to render the number of erasure symbols to be pseudo-corrected equal to the value of NOS (top left corner of FIG. 8c).

THE GALOIS-FIELD ARITHMETIC UNIT (GFA)

Figure 9:
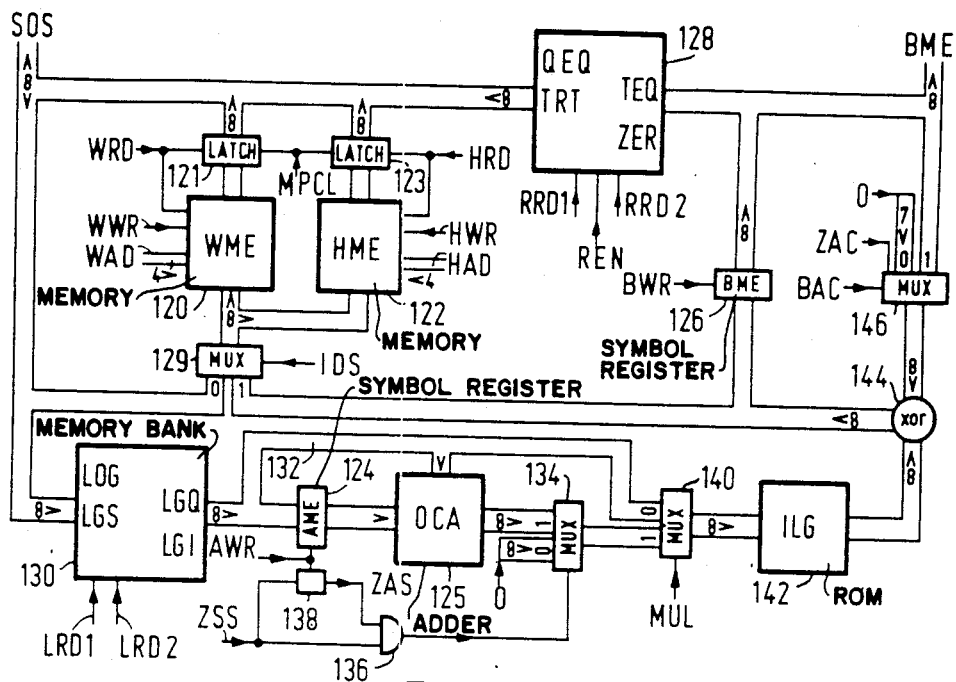
FIG. 9 shows an arithmetic unit for the Galois-field.

FIG. 9 shows the arithmetic unit for the Galois-field $GF(2^8)$. A GFA unit has already been published in the U.S. Pat. No. 4,162,480 in the name of E. R. Berlekamp. The external connections SOS, BME, ZSS and the control by the control unit 64 have already been briefly described with reference to FIG. 4. The unit described herein is optimized for a limited value of the minimum Hamming distance, that is to say 7. The processor memory of the GFA unit consists of the memories WME (120) and HME (122), each of which is provided with relevant latch memory (121, 123) which is connected to the data output which can be made transparent by the signals WRD, HRD. Also provided are a symbol register AME (124) for symbols in the logarithmic mode, and a symbol register BME (126) for symbols in the vector notation. The relevant write control signals are WWR, HWR, AWR and BWR. The signal IDS controls the multiplexer 128 for filling the two memories directly or not. The addresses for the two RAM-memories (16×8) are the 4-bit signals WAD, HAD. At an elementary scale there are eight feasible source elements for the bus SOS, that is to say:

| | |
|---|---|
| WME | WRD = 1 |
| HME | HRD = 1 |
| EME1, 2 (already discussed) | ERD = 1 |
| SØ | SRD = 1 |
| QEQ | REN = 1; RRD1 = RRD2 = 0 |
| TEQ | REN = RRD1 = 1; RRD2 = 0 |

-continued

| | |
|---|---|
| TRT | REN = RRD2 = 1; RRD1 = 0 |
| BME | REN = RRD1 = RRD2 = 1. |

Element S0 contains the next syndrome symbol; each of the elements QEQ, TEQ, TRT is formed by a read-only memory for 256 memory words of 8 bits, said elements being shown in combined form in block 128. The latter three elements are addressed by the 8-bit address BME. The contents of the three read-only memories is as follows for the relevant values of BME:

QEQ: an arbitrary zero point of the equation $X^2+X+BME=0$;

TEQ: an arbitrary zero point of the cubic equation $X^3+X+BME=0$;

TRT: the cube root of BME.

If the relevant root does not exist or does not form an element of the relevant Galois-field, the value HEX00 will be present at the relevant memory location.

The circuit also comprises a further memory bank 130 which comprises four read-only memories LOG, LGS, LGQ, LGI, each of which has a capacity of 256 8-bit memory locations. The information on the bus SOS acts as an address; the data appears on connection 132. The selection between the four parts is as follows: LOG: LRD1=LRD2=0; LGQ: LRD1=1, LRD2=0; LGS: LRD1=0, LRD2=1; LGI: LRD1=LRD2=1.

At the address $(a^i)$, the memory LOG contains the value i, but in the location 0 it contains the value HEX00 and in the location 1 the value HEXFF. At the address $(a^i)$ the memory LGQ contains the value (2i-mod 255), but in location 0 it contains the value HEX00 and in location 1 the value HEXFF. Thus, a logarithmic procedure can be followed with the variable itself (SOS bus) as well as the square thereof. At each address $(a^i)$ the memory LGI contains the value (256−i), but in the location 0 it contains the value 0. Thus, the logarithm of the inverse value can be used. At each address $(a^{2i,mod\ 255})$, the memory LGS contains the value i, but in the location 0 it contains the value HEX00 and in the location 1 the value HEXFF. The logarithm of the square root can thus be used.

The element OCA 124 is an adder for numbers in 1-complement notation, modulo 255. To this end, one operand is stored in a latch register 124 under the control of a signal AWR, the second operand being applied directly via the connection 132. The result of the addition is applied to a multiplexer 134 which is controlled by the output signal of an AND-gate 136. A multiplication (or division) is thus realized by the addition of the exponents. The bit value ZSS=0 indicates whether one of the factors has the value 00. Under the control of the load signal AWR, storage takes place in the latch circuit 138. When one or both factors have the value "0", the second input of the multiplexer is activated to present HEX00 on the output. When the signal MUL has the value "1", multiplexer 140 becomes coductive for the (pseudo) product. When MUL=0, the output of block 130 is directly connected to the input of block 142. The block 142 is a read-only memory having a capacity of 256 8-bit locations. At each address i, this memory ILG contains the value $(a^i)$, but in location 0 it contains the value HEX00 and in the location 255 the value HEX01. The antilog transformation is thus performed. The result can be applied to register 126 or multiplexer 129 via an exclusive-OR circuit 144. The register BME is used for intermediate results in an accumulation operation in that the output of the register is retrocoupled to its input via multiplexer 146 and EXOR 144. Accumulation takes place if BAC=1. If BAC=0, the value of ZAC determines the accumulation with the value HEX00 or with the value HEX01.

Figure 10:
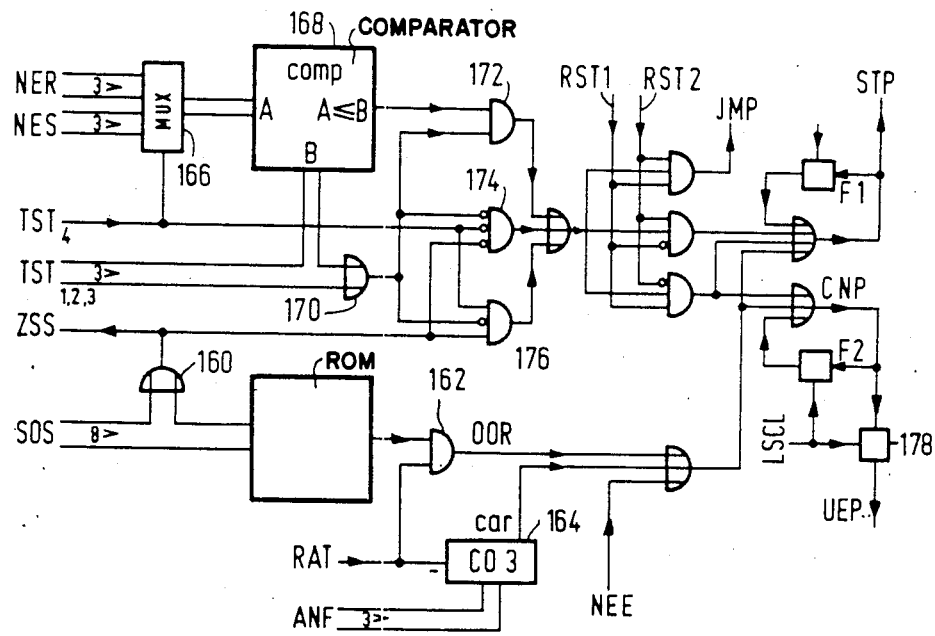
FIG. 10 shows a test unit for given conditions.

FIG. 10 shows a block diagram of the test unit 62 of FIG. 4. Therein a number of assumptions in the decoding process are tested. Depending on the test result, the program stops, a jump is made, or the program continues with the next program step. The table 1 at the conclusion of the present description contains the assumptions, which can be tested. Actually, the third and the fourth line form seven separate tests each.

The results of the first 16 tests can be classified as follows.

(a) when the test result is negative or when RST1=RST2=0, the program continues as usual with the result signals JMP=STP=CNP=0;

(b) when the test result is positive and, moreover, RST1=1, RST2=0, the program stops because correction is impossible, the result signals being JMP=0, STP=CNP=1;

(c) when the test result is positive and, moreover, RST1=0, RST2=1, the program stops because the correction has been completed, the result signals being JMP=0, STP=1, CNP=0;

(d) when the test result is positive and, moreover, RST1=RST2=1, a jump is made in the program, the result signals being JMP=1, STP=CNP=0.

When the signal RAT has the value "1" and the symbol value SOS does not form an element of the set $a^i$, where $0 \leq i \leq n-1$, the program stops. In that case the code word is uncorrectable because a real correction would occur in a symbol position outside the code word (if n=255, of course, this case does not occur). In this case the signal OOR becomes active and STP=CNP=1.

The signal NEE=1 means that the number of erasure symbols is larger than permissible in accordance with the chosen strategy. In that case the program again stops immediately upon the relevant detection and correction is considered to be impossible.

Using the variable ANF, the number of symbols to be corrected in excess of the number of erasure symbols can be specified. When the number of additionally detected error symbols is excessively large, the program stops immediately upon the relevant detection and the code word is considered to be uncorrectable.

Immediately before the first symbol of the next code word is received, the bit CNP is stored in the register UEP and the register bits F1, F2 are reset to zero.

In this respect the circuit of FIG. 10 comprises the following elements:

an 8-bit wide OR-gate 160 for detecting a symbol HEX00;

a read-only memory RAM which indicates, for all symbol locations received (in the form of exponents of a) and during a "1", whether the relevant symbol position is situated inside or outside the code word;

an AND-gate 162 for producing said signal OOR under the control of the enable signal RAT;

a counter for storing the variable ANF and for decrementing this variable when the signal RAT becomes active; when a carry signal is formed, an uncorrectable situation has been detected. The load signal of the counter appears just before the first symbol of the next code word is received;

a multiplexer 166 for conducting, under the control of the signal TST4, alternatively the variable NER or the variable NES to the comparator 168;

the latter compares the input variable A with the input variable B; the condition is shown;

a 3-bit wide OR-gate 170 receives the variables TST1, 2, 3 for activating the AND-gates 172/174/176 whose inverting inputs are shown with a circle.

The conditions are thus tested, the remainder of the circuit providing, co-controlled by the signals RST1, RST2, NEE and load control signals for the register bit positions F1, F2, the decoding into the signals JMP, STP, CNP and UEP. Element 178 is a further register bit position for the signal UEP.

CONTROL UNIT

Figure 11:
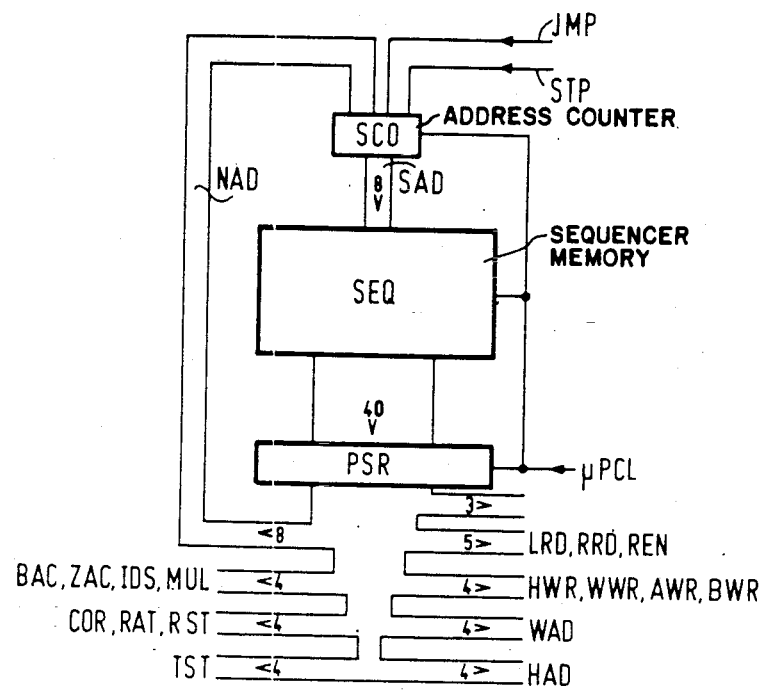
FIGS. 11, 11a show a control unit utilizing a sequencer.
Figure 11A:
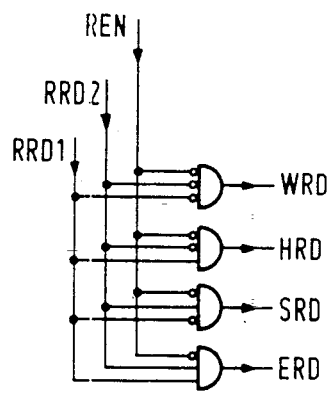

The control unit (64 in FIG. 4) is shown in greater detail in FIG. 11, FIG. 12 showing the associated information structure. The central element is formed by the sequencer memory SEQ having a read-only capacity of 256 words of 40 bits. The 8-bit address is present in the address counter SCO. In the reset condition of the address counter SCO, the address is HEX00 and a void instruction is applied to a program status register PSR. The activation of the elements SCO (incrementation), SEQ (reading) and PSR (storage) is synchronized by the clock signal MPCL. The counter is started as soon as the first symbol of the new word is received, unless the signal NEE has the value 1 because the blocking signal STP is formed on the basis thereof. Under the control of the jump signal JMP, the counter SCO is loaded with the part NAD of the register PSR. The relevant groups of information bits in the register PSR are identified by their mnemonics. In this respect FIG. 11a shows the decoding of the two bits RRD (1, 2) and REN in order to obtain four further control bits (evidently, these could also be directly stored in the memory SEQ by making the latter wider). The maximum clock frequency of MPCL is now determined by the maximum value of the following delays:

(a) the signal transfer time in the loop starting from and ending in the register PSR via elements WME, the test unit, the counter SCO and the memory SEQ;

(b) or the period of time required for reaching the unit WME again from the register PSR, via WME and the units LOG, OCA and ILG.

The first four bits in FIG. 12 denote the address WAD (FIG. 9) and the second four bits denote the address HAD, so that the relevant memory location is capable of communicating with the bus. The bits 8, 9, 10 are applied to element 128 in FIG. 9 and to the circuit of FIG. 11a, thus selecting the source element for the bus SOS. The bits 11, 15 and 19 are free. The bits 12, 13, 14 are used as selection bits in FIG. 9. if IDS=0, direct access occurs. The bits 16, 17 form a two-bit address, LRD2 having the highest significance. The bits 18 and 20 are applied to the elements 124 and 140, respectively. The bits 21, 22, control element 146. The bit 23 controls element 126. The bit 24 is used in FIG. 7b. The bits 24–27 are used in FIG. 10, the bits 26, 27 forming a 2-bit code; if this code is "0", "nothing" is done. If this code is "1", correction is not possible, if this code is "2", the correction is already and if this code is "3", a jump is made. The bits 28–31 form a four-bit value which is decoded as shown. The bits 32–39 form the next address for the unit SEQ.

THE ALGORITHM

The algorithm for the various operations comprises several operation modules:

a. generating the syndrome symbols, storing the symbols, determining the erasure locations (see table 2 at the conclusion of this description).

The given programs are written in a language which corresponds to the language RTL/2 to such an extent that the differences are evident and hence transparent. Assume that the word received is:

$$r(x) = \sum_{i=0}^{n-1} r_i x^{n-i-1}$$

There may be errors in the symbols in unknown locations $i_1, i_2 \ldots i_t$, with unknown values, and erasure symbols in known locations $i_{t+1} \ldots i_{t+e}$, again with unknown values. $Y_j$ is the error value, i.e. the difference between the received symbol and the correct symbol having the number $(i_j)$. Furthermore, the position of this symbol is defined as $X_j = a^{n-j-(ij)}$. The syndrome symbols are:

$$S_j = \sum_{i=0}^{n-1} r_i(a^{b+j})^{n-1-i} = \sum_{i=1}^{t+e} Y_i X_i^{b+j}.$$

As is shown above, they are formed one step after the other, all provisional syndrome symbols being updated each time when a next symbol of the code word is received.

b. The further algorithm is controlled by the sequencer SEQ. First of all, the syndrome symbols are modified so that in the (d−1−e) symbols thereof the effect of erasure symbols has been removed by multiplication of the matrix (H) by a non-singular matrix A of (d−1)×(d−1) elements so that the columns $i_j$ of the matrix (AXH) for $t+1 \leq j \leq t+e$ contains zeroes in the first (d−1−e) positions. The positions (columns) $i_j$ correspond to the "t" error locations for $1 \leq j \leq t$ and to the "e" erasure locations for $t+1 \leq j \leq t+e$. In order to simplify a description thereof, for $0 \leq k \leq t+e-1$ and $0 \leq j \leq d-2 = k$ the following modified syndrome symbols are defined;

$$S_j^{(0)} = S_j \text{ if } k = 0$$

$$S_j^{(k)} = S_j^{(k-1)} - X_{t+e+1-k}^{-1} S_{j+1}^{(k-1)} \text{ if } k > 0 \text{ and}$$

$$Y_j^{(0)} = Y_j \text{ if } k = 0$$

$$Y_j^{(k)} = (1 - X_j X_{t+e+1-k}^{-1}) Y_j^{(k-1)} \text{ if } k > 0$$

It follows therefrom that:

$$S_j^{(k)} = \sum_{i=1}^{t+e-k} Y_i^{(k)} X_i^{(b+j)} \text{ for } 0 \leq j \leq d-2-k.$$

Table 3 shows the syndrome symbols then produced. The arrows indicate the formation of a modified syndrome symbol. For two erasure symbols, the third line of the table suffices for finding back any errors.

The modification for the effect of the erasure symbols is given in table 4. It is notably no longer necessary to calculate the coefficients of the locator polynomial of the erasure symbols.

c. Now there are still (d−1−e) syndrome symbols whereby, using the key equation, t symbol errors can be corrected, via the locating of the error positions, provided that 2t<d−1−e. For 0≦j≦d−2−e it now holds good that:

$$S_j^{(e)} = \sum_{i=1}^{t} Y_i^{(e)} X_i^{(b+j)}.$$

When the error locations have been found, only the problem remains that (t+e) erasure values $Y_j(1 \leq j \leq t+e)$ must be found, given the positions $X_j(1 \leq j \leq t+e)$. The positions can be found in known manner, for example from the key polynomial as described in said Patent Application. This will be described in detail hereinafter. Below a simple algorithm is given for determining the erasure values. This can also be readily used for the encoding, because the redundant symbols are then arranged in known positions. The following modified syndrome symbols are required:

$$S_0^{(k)} = \sum_{j=1}^{e+t-k} Y_j^{(k)} X_j^b = \sum_{j=1}^{e+t-k} Y_j X_j^b \pi_{i=1}^{k}(1 - X_j X_{t+e+1-i}^{-1}),$$

in which 0≦k≦t+e−1 and the continual product $$\pi_{i=a}^{b}$$

obtains the value 1 for a>b. The calculation of the values $S_0^{(k)}$ for e+1≦k≦e+t is as shown in table 5.

d. From the syndrome symbols thus found or modified, the values of the erasure symbols are iteratively determined. This is because for i≦j, k≦t+e it holds good what is shown in table 6.

As already been stated, for the present embodiment the arbitrary value b=0 has been chosen. Notably in the calculation used it is not necessary to utilize the error locators and erasure locators in an intermediate step. The left-hand member of the last equation is iteratively determined as shown in table 7.

e. The problem remaining is the finding of the error locations by way of the modified syndrome symbols $S_j^{(e)}, 0 \leq j \leq d-e-2$. This is done by means of the error locator polynomial sigma (X), which is the continual product $$\text{sigma }(X) = \pi_{j=1}^{t}(1 - XX_j^{-1}) = X^t + \sigma_1 X^{t-1} + \ldots \sigma_{t-1}X + \sigma_t.$$

$\sigma(X_j) = 0$ for $j = 1, 2 \ldots t$, and $$0 = Y_j^{(e)} X_j^{b+k} \sigma(X_j) = Y_j^{(e)} X_j^{b+k+t} + \sigma_1 Y_j^{(e)} X_j^{b+k+t-1} + \ldots + \sigma_t Y_j^{(e)} X_j^{b+k}.$$

The addition of this set of equations for 1≦j≦t results in the key equation:

$$0 = S_{k+t}^{(e)} + \sigma_1 S_{k+t-1}^{(e)} + \ldots + \sigma_{t-1}S_k^{(e)} + \sigma_t S_k^{(e)}$$

and all $S^{(e)}$ are known for 0≦k≦d−2−e−t. Thus, this represents a set of (d−1−e−t) linear equations in t unknowns $\sigma_i(1 \leq i \leq t)$. These can be written in matrix forms as

$$\underline{\sigma} M_t^T = \underline{S}.$$

in which $$\underline{\sigma} = (\sigma_1, \sigma_2 \ldots \sigma_t) \text{ and } \underline{S} = (-S_t^{(e)}, -S_{t+1}^{(e)}, \ldots, -S_{d-2-e}^{(e)})$$

and:

$$M_t = \begin{bmatrix} S_{t-2}^{(e)} & S_{t-2}^{(e)} & \ldots S_1^{(e)} & S_0^{(e)} \\ S_t^{(e)} & \ldots & & \\ \cdot & & & \cdot \\ \cdot & & & \cdot \\ S_{d-3-e}^{(e)} & S_{d-4-e}^{(e)} \ldots S_{d-1-e-t}^{(e)} & S_{d-2-e-t}^{(e)} \end{bmatrix}$$

$M_{t,i}$ is the matrix which consists of the first i rows of this matrix in as far as 1≦i ≦d−1−e−t. This matrix is non-singular when the variables $S_j^{(e)}$ are formed from exactly t non-zero pairs $Y_j^{(e)}$, $X_j$. When this number is smaller, the matrix is singular. When this number is larger, both cases are possible. When the matrix $M_{0,0}$ is not singular, the search for the word which is nearest as regards code distance and which contains t errors is similar to the search for a value of i, so that $M_{i,i}$ is non-singular and each matrix $M_{j,j}$ is singular for 0≦i≦j≦[(d−1−e)/2]. When the number of errors has thus been found, the expression for $\sigma$ is solved by means of Cramer's rule. Assume that $M_t(j)$ is the matrix dimensioned txt by replacing the last row of $m_{t,t}$ by the $j^{th}$ row of $M_t(1 \leq t \leq j \leq d-1-e-t)$. In that case, if i≦[(d−1−e)/2], $M_{j,j}$ is singular for t+1≦j≦i, only if $M_{t+1}(j)$ is singular for t+1≦j≦i.

When such a value is found for t that $M_{t,t}$ is non-singular and $M_{t+1}(j)$ is singular for t+1≦j≦[(d−1−e)/2], t errors may have occurred only if $M_{t+1}(j)$ is singular for [(d−1−e)/2]≦j≦d−1−e−t, the actual number of errors otherwise being larger than [d−1−e)/2]. Furthermore, if $M_{t,t}$ is non-singular, $M_{t+1}(j)$ is singular for t+1≦j≦i≦[(d−1−e)/2], and $M_{t+1}(i)$ is non-singular, the actual number of errors equals at least i.

Assume that $$M_{t+1,t}^{(i)}$$

is the matrix dimensioned txt, in which the $i^{th}$ column of $M_{t+1,t}$ has been removed (1≦i≦t+1). Notably $$M_{t+1,t}^{(1)} = M_{t,t} \cdot t \text{ and } \sigma_i$$

are then found (the finding of the locator of an additional error) as shown in table 8.

The entire structure of the matrix $M_{t+1,t}$ is not extensively used in the above alorithm. This determination of the new value of $\sigma_i$ from the old value results in a smooth and fast algorithm, notably for small values of t.

f. Once the locator values $\sigma_i$ have been found for the t errors, the zero points must be found of the polynomial sigma (X) in the Galois-field $GF(2^8)$. When there are less than t zero points, there will be more errors than [(d−1−e)/2], which is uncorrectable. Such a search operation has been proposed by Chien and described in the cited Patent Application No. 8302214 (PHN 10.710), correspond to U.S. patent application Ser. Nos. 562,611 and 824,299. (See table 9 for the program).

For a small number of errors, notably for a polynomial sigma (X) of only the second or the third degree, usually hybrid methods are used. q is then a power of 2. For each $\beta$ in GF(q) there is defined QEQ ($\beta$) is an arbitrary root of the equation $X^2+X+\beta=0$ if this root exists, and otherwise zero.

TEQ ($\beta$) is an arbitrary root of the equation $X^3+X+\beta=0$ if this root exists, and otherwise zero.

Only is q=1 mod 3, TRT ($\beta$) will be a third root of $\beta$ if this root exists, and otherwise zero. Notably TRT(1)≠1. Notably all roots of $\sigma(x)=0$ differ from zero and from one another.

g. For two errors, the operation is as shown in table 10.

h. For three errors, the solution is as shown in table 11.

The values QEQ, TEQ, TRT are stored in read-only memories as shown. All values $X_1 \ldots$ differ from one another and from zero. Moreover, they must be situated within the word length, which means that they must form an element of the set $\{a^i 0 \leq i \leq n-1\}$, because otherwise an uncorrectable error pattern is concerned.

TABLE 1

SOS = 0 by TST1 = TST2 = TST3 = TST4 = 0,
SOS ≠ 0 by TST1 = TST2 = TST3 = 0 and TST4 = 1,
NER $\leq$ i for $1 \leq i \leq 7$ by TST1 + 2 × TST2 + 4 × TST3 = i and TST4 = 0,
NES $\leq$ i for $1 \leq i \leq 7$ by TST1 + 2 × TST2 + 4 × TST3 = i and TST4 = 1,
SOS $\{a^i | 0 \leq i \leq n - 1\}$ by RAT = 1.

TABLE 2

FOR j: = 0 TO d − 2 DO $S_j$: = 0 REP;
e: = 0;
FOR i: = 0 TO n − 1 DO
r[$a^{n-i}$]: = 'next symbol received';
f[$a^{n-i}$]: = 'next symbol-flag received';
FOR j: = 0 TO d − 2 DO $S_j$: = r[$a^{n-i}$] + $S_j \times a^{b+j}$ REP;
IF f[$a^{n-i}$] = 1 THEN e: = e + 1; $X_{t+e}$: = $a^{n-1-i}$ END;
REP;
IF e > d − 1 THEN 'uncorrectable error pattern' END;

TABLE 3

$S_0^{(0)} \; S_1^{(0)} \; S_2^{(0)} \; S_3^{(0)} \; S_4^{(0)} \; S_5^{(0)}$ $S_0^{(1)} \; S_1^{(1)} \; S_2^{(1)} \; S_3^{(1)} \; S_4^{(1)}$ $S_0^{(2)} \; S_1^{(2)} \; S_2^{(2)} \; S_3^{(2)}$

TABLE 4

FOR k: = 1 TO e DO
FOR j: = 0 TO d − 2 − k DO $S_j^{(k)}: = S_j^{(k-1)} - X_{t+e+1-k}^{-1} S_{j+1}^{(k-1)}$

REP
REP;

TABLE 5

FOR k: = 1 TO t DO
FOR j: = 0 TO t − k DO $S_j^{(e+k)}: = S_j^{(e+k-1)} - X_{t+1-k}^{-1} \times S_{j+1}^{(e+k-1)}$

REP
REP;

TABLE 6

$S_0^{(t+e-k)}(j) := S_0^{(t+e-k)}$ if j = 1

$S_0^{(t+e-k)}(j) := (1 - X_k X_j^{-1})^{-1} S_0^{(t+e-k)}(j - 1)$ if j > k $S_0^{(t+e-k)}(j + 1) := S_0^{(t+e-k)}(j) - S_0^{(t+e-j)}(k)$ if j < k; &

$S_0^{(t+e-k)}(j) = \sum_{i=j}^{k} Y_i X_i^b \prod_{p=1+k}^{t+e} (1 - X_i X_p^{-1})$ if $j \leq k$ $S_0^{(t+e-k)}(j) = Y_k X_k^b \prod_{p=1+j}^{t+e} (1 - X_k X_p^{-1})$ if $j \geq k \rightarrow$ $S_0^{(t+e-j)}(t + e) = Y_j X_j^b \; (1 \leq j \leq t + e)$

TABLE 7

FOR k: = 1 TO t + e − 1 DO
FOR j: = k + 1 TO t + e DO $S_0^{(t+e-k)}(j): = (1 - X_k X_j^{-1})^{-1} S_0^{(t+e-k)}(j - 1);$ $S_0^{(t+e-j)}(k + 1): = S_0^{(t+e-j)}(k) - S_0^{(t+e-k)}(j)$

REP
REP;

TABLE 8 t: = 0; j: = 0;
WHILE j < d − 1 − e − t DO
j: = j + 1;
IF det $|M_{t+1}(j)| \neq 0$ THEN
t: = j; $\sigma_0$: = det $|M_{t,t}|$;
FOR i: = T0 t DO $\sigma_i = (-1)^i \times $ det $|M_{t+1,t}^{(i+1)}|/\sigma_0$ REP
END
REP;
IF 2 × t + e > d − 1 THEN
'uncorrectable error pattern' END;

TABLE 9

$\sigma_0$: = 1; k: = 0;
FOR j: = 0 TO n − 1 DO

IF $\sum_{i=0}^{t} \sigma_i = 0$ THEN k: = k + 1; $X_k$: = $a^j$
END;
FOR i: = $\phi$ TO t − 1 DO $\sigma_i$: = $\sigma_i \times a^{t-i}$ REP
REP;
IF k ≠ t THEN 'uncorrectable error pattern' END;

TABLE 10

IF $\sigma_1$ = 0 OR $\sigma_2$ = 0 THEN 'uncorrectable error pattern'
ELSE set X = $\sigma_1 \times$ Y;

$Y^2 + Y + \sigma_1/\sigma_1^2 = 0$ must be solved;

v: = QEQ ($\sigma_1/\sigma_1^{-2}$);

IF v = 0 THEN 'uncorrectable error pattern'
ELSE $X_1$: = $\sigma_1 \times v$;
$X_2$: = $\sigma_1 + X_1$
END
END;

TABLE 11 set X = $\sigma_1$ + Y;

TABLE 11-continued $Y^3 + Y(\sigma_1^2 + \sigma_2) + (\sigma_3 + \sigma_1\sigma_2) = 0$ must be solved;

IF $\sigma_3 = 0$ OR $(\sigma_3 + \sigma_1\sigma_2) = 0$ THEN 'uncorrectable error'

ELSE IF $\sigma_1^2 + \sigma_2 \neq 0$ THEN set $Y = Z(\sigma_1^2 + \sigma_2)^{\frac{1}{2}}$;

$Z^3 + Z + (\sigma_3 + \sigma_1\sigma_2)/(\sigma_1^2 + \sigma_2)^{3/2} = 0$ must be solved;

$\mu := \text{TEQ}((\sigma_3 + \sigma_1\sigma_2)/(\sigma_1^2 + \sigma_2)^{3/2})$;

IF $\mu = 0$ THEN 'uncorrectable error pattern'
ELSE $Z^2 + \mu Z + (1 + \mu)^2 = 0$ must be solved;
$\upsilon := \text{QEQ}(1 + \mu^{-2})$;
IF $\upsilon = 0$ THEN 'uncorrectable error pattern'

ELSE $X_1 := \sigma_1 + (\sigma_1^2 + \sigma_2)^{\frac{1}{2}} \times \mu$;

$X_2 := \sigma_1 + (\sigma_1^2 + \sigma_2)^{\frac{1}{2}} \times \mu \times \upsilon$;

$X_3 := \sigma_1 + X_1 + X_2$
END
END
ELSE $\mu := \text{TRT}(\sigma_3 + \sigma_1\sigma_2)$;
IF $\mu = 0$ THEN 'uncorrectable error pattern'
ELSE $X_1 := \sigma_1 + \mu$;
$X_2 := \sigma_1 + \mu \times \text{TRT}(1)$;
$X_3 := \sigma_1 + \mu \times \text{TRT}(1)^2$
END
END;

What is claimed is:

1. A device for decoding multisymbol code words protected from errors by a Reed-Solomon code for each multisymbol code word comprising:
   means for sequentially receiving code symbols contained in said code words including a buffer means for storing the code symbols of a code word including erasure indications which relate to a code symbol;
   a first arithmetic means connected to said means for receiving for multiplying said code symbols by a parity check matrix for producing a plurality of syndrome symbols for each code word;
   second arithmetic means connected to said first arithmetic means for receiving said plurality of syndrome symbols, and connected to said buffer means for receiving said erasure indications, said second arithmetic means including a log table for converting a Galois-field element to an associated power of the basic element of the Galois-field, and including means for converting said associated power of the basic element to a second Galois-field element, said second arithmetic means in response to an erasure indication updating the syndrome symbols for each code symbol which is identified as being an erasure symbol and for reducing said plurality of syndrome symbols one symbol for each erasure signal, said second arithmetic means solving a key equation for any remaining syndrome symbols up to a maximum equal to an integer portion of one half the number of said syndrome symbols which remain, using a zero point of an error locator polynomial, and for evaluating each error position thus located for an error value for said error position, and treating each symbol of an error position as a secondary erasure symbol.

2. A decoding device as claimed in claim 1, for code words which are systematic at the symbol level, wherein said first arithmetic means includes a control input (EDS) for receiving an encoding/decoding signal in order to form syndrome symbols from a code word under the control of the decoding signal, and to subsequently form a set of error locations from the syndrome symbols, and an error value for each error location, and to form under the control of an encoding signal a series of parity symbols from a series of data symbols which have been corrected with respect to the already present symbols.

3. A decoding device as claimed in claim 1 or 2, wherein said buffer means comprises two alternating buffer elements SME1, 2, each of which serves to accommodate a complete code word, each buffer element having a memory EME1, 2 for the erasure locations, each of said memories being addressed by an associated counter ECO1, 2 which is decremented by a read control signal and which is incremented by a write control signal.

4. A decoding device as claimed in claim 1, wherein said Galois-field arithmetic unit comprises a chain which is formed by a converter for converting a symbol into an element of the set comprising an exponent, double exponent, inverted exponent, halved exponent, a selectively activatable adder which is provided with a bypass, and a second converter for reconverting an exponent into the associated symbol.

5. A decoding device as claimed in claim 1, wherein said first arithmetic means comprise a parallel connection of $(d-1)$ registers, each of which serves for a provisional syndrome symbol, a series connection of $(d-2)$ multiplier elements for multiplying each symbol received by the basic element of the relevant Galois-field, each multiplier element being connected between the inputs of two successive registers, per code word symbol received, the registers being cyclically driven in the sequence of the multiplier elements, an exclusive-OR circuit XOR which comprises a code symbol input and a feedback input which is fed by all registers of the parallel connection, the output of the exclusive-OR circuit being reconnected to the series connection forming an output of the first arithmetic means.

6. A decoding device as claimed in claim 5, wherein between the exclusive-OR circuit and the input of the series connection there is connected a further symbol register (SR).

7. A decoding device as claimed in claim 1, wherein said buffer means comprise a counter (LCO) which can be loaded by an adjustable register (WLE) in order to count down the number of symbols received and to form a reception ready signal when a predetermined position is reached.

8. A decoding device as claimed in claim 1, wherein said second arithmetic means comprise a strategy-determining register (56) for storing the permissible number of erasure symbols and for supplying an uncorrectability signal when a larger number of erasure symbols is received in a code word.

9. A decoding device as claimed in claim 8, wherein said second arithmetic means comprises a second strategy-determining register for storing the permissible number of error symbols in excess of the erasure symbols and supplies an uncorrectability signal when the number of error symbols found in a code word is larger than said permissible number.

10. A decoding device as claimed in claim 4, wherein said Galois-field arithmetic unit comprises two parallel-connected memories which are bidirectionally connected to said chain as well as to a connection to further parts of the second arithmetic means.

* * * * *